United States Patent [19]
Pedersen

[11] Patent Number: 6,130,555
[45] Date of Patent: *Oct. 10, 2000

[54] DRIVER CIRCUITRY FOR PROGRAMMABLE LOGIC DEVICES

[75] Inventor: Bruce B. Pedersen, San Jose, Calif.

[73] Assignee: Altera Corporation, San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/022,663

[22] Filed: Feb. 12, 1998

Related U.S. Application Data
[60] Provisional application No. 60/061,748, Oct. 13, 1997.

[51] Int. Cl.[7] .................... H03K 19/094; H03K 19/02
[52] U.S. Cl. ............................................. 326/44; 326/58
[58] Field of Search .................. 326/41, 47, 38, 326/39, 44, 58, 57

[56] References Cited

U.S. PATENT DOCUMENTS

| | | | |
|---|---|---|---|
| Re. 34,363 | 8/1993 | Freeman | 307/465 |
| 3,473,160 | 10/1969 | Wahlstrom | 340/172.5 |
| 4,609,986 | 9/1986 | Hartmann et al. | 364/200 |
| 4,617,479 | 10/1986 | Hartmann et al. | 307/465 |
| 4,642,487 | 2/1987 | Carter | 307/465 |
| 4,677,318 | 6/1987 | Veenstra | 307/465 |
| 4,713,792 | 12/1987 | Hartmann et al. | 364/900 |
| 4,758,745 | 7/1988 | Elgamal et al. | 307/465 |
| 4,774,421 | 9/1988 | Hartmann et al. | 307/465 |
| 4,871,930 | 10/1989 | Wong et al. | 307/465 |
| 4,879,688 | 11/1989 | Turner et al. | 365/201 |
| 4,899,067 | 2/1990 | So et al. | 307/465 |
| 4,912,342 | 3/1990 | Wong et al. | 307/465 |
| 5,023,606 | 6/1991 | Kaplinsky | 340/825.8 |
| 5,121,006 | 6/1992 | Pedersen | 307/465 |
| 5,144,166 | 9/1992 | Camarota et al. | 307/465.1 |
| 5,208,491 | 5/1993 | Ebeling et al. | 307/465 |
| 5,220,214 | 6/1993 | Pedersen | 307/465 |
| 5,231,312 | 7/1993 | Gongwer et al. | 307/465 |
| 5,241,224 | 8/1993 | Pedersen et al. | 307/465 |
| 5,258,668 | 11/1993 | Cliff et al. | 307/465 |
| 5,260,610 | 11/1993 | Pedersen et al. | 307/465 |

(List continued on next page.)

FOREIGN PATENT DOCUMENTS

| | | | |
|---|---|---|---|
| 0 225 715 A2 | 6/1987 | European Pat. Off. | H03K 19/173 |
| WO 92/15152 | 9/1992 | WIPO | H03K 19/173 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

"XC5000 Logic Cell Array Family, Technical Data Advance Information," Xilinx, Inc., Feb. 1995.

*Primary Examiner*—Michael Tokar
*Assistant Examiner*—Jamse H. Cho
*Attorney, Agent, or Firm*—Fish & Neave; Robert R. Jackson; Joo-Youn Park

[57] ABSTRACT

Buffers for driving interconnection conductors on programmable logic devices are shared between two types of uses, i.e., to drive static programmable connections to interconnection conductors, and to drive dynamically controllable connections to other interconnection conductors. The dynamically controllable connections are preferably tristatable. Signals for effectuating the dynamic control are preferably generated on the programmable logic device near the tri-state-type connections. For example, a nearby logic module ("subregion") may provide the dynamic control signal. This reduces the extent of routing for, and consequent delay of, the dynamic control signal.

13 Claims, 5 Drawing Sheets

U.S. PATENT DOCUMENTS

| | | | |
|---|---|---|---|
| 5,260,611 | 11/1993 | Cliff et al. | 307/465 |
| 5,274,581 | 12/1993 | Cliff et al. | 364/784 |
| 5,350,954 | 9/1994 | Patel | 307/465 |
| 5,371,422 | 12/1994 | Patel et al. | 326/41 |
| 5,384,500 | 1/1995 | Hawes et al. | 326/39 |
| 5,386,155 | 1/1995 | Steele et al. | 326/37 |
| 5,448,186 | 9/1995 | Kawata | 326/41 |
| 5,451,887 | 9/1995 | El-Ayat et al. | 326/39 |
| 5,483,178 | 1/1996 | Costello et al. | 326/41 |
| 5,504,439 | 4/1996 | Tavana | 326/38 |
| 5,894,228 | 4/1999 | Reddy et al. | 326/39 |
| 5,898,320 | 4/1999 | Li et al. | 326/58 |

DRIVER CIRCUITRY FOR PROGRAMMABLE LOGIC DEVICES

This application claims the benefit of U.S. provisional patent application No. 60/061,748, filed Oct. 13, 1997.

BACKGROUND OF THE INVENTION

This invention relates to programmable logic devices, and more particularly to driver circuitry usable in the interconnection resources of such devices.

A typical programmable logic device has a plurality of regions of programmable logic disposed on the device in a two-dimensional array of intersecting rows and columns of such regions. Each region may include a plurality of subregions of programmable logic. Each subregion may include (1) a four-input look-up table which is programmable to produce an output signal that is any logical combination of the four inputs applied to the look-up table, (2) a register (flip-flop) for registering the output signal of the look-up table, and (3) circuitry for allowing the final output of the subregion to be either the registered or unregistered output signal of the look-up table. Interconnection conductors are provided on the device for conveying signals to, from, and between the subregions in each region, as well as to, from, and between the regions. For example, horizontal interconnection conductors may be associated with each row of regions for conveying signals to, from, and between the regions in the associated row. Vertical interconnection conductors may be associated with each column of regions for conveying signals to, from, and between the rows. And local conductors may be associated with each region for conveying signals to, from, and between the subregions in that region. Programmable interconnections are provided for making connections between the various types of interconnection conductors so that signals can be routed throughout the device in a great many different ways. For example, the local conductors associated with each region may be programmably interconnectable to the horizontal and/or vertical conductors adjacent to that region. Similarly, intersecting horizontal and vertical conductors may be programmably interconnectable.

Various kinds of drivers may be provided for driving signals from the subregions out onto the adjacent interconnection conductors. For example, certain of the horizontal and vertical conductors adjacent to each region may be driven by the output signals of that region's subregions via a buffer and an NMOS pass gate. Each such buffer may be capable of driving one or more horizontal and/or vertical conductors. Each pass gate is controlled by an associated static programmable element. Alternative driver circuitry involves the use of tri-state drivers feeding tri-state lines. The enable signal for each tri-state buffer is generated elsewhere on the device or comes from an input pin. Thus each such enable signal must be explicitly routed to each tri-state driver that it controls. This can result in extra delay in the enable path and may require considerable routing resources.

In view of the foregoing, it is an object of this invention to provide improved driver circuitry for programmable logic devices.

It is a more particular object of this invention to provide improved tri-state-type driver circuitry for programmable logic devices.

SUMMARY OF THE INVENTION

These and other objects of the invention are accomplished in accordance with the principles of the invention by providing programmable logic devices having buffers that are used for both driving some interconnection conductors via static programmable connections and driving other interconnection conductors via tri-state-type connections, with the enable signal for the tri-state-type connections coming from the logic adjacent to those connections. The signal buffered by each buffer may come from a subregion adjacent to that buffer or from interconnection conductors adjacent to that buffer. The output signal of each buffer may be applied to one or more adjacent interconnection conductors via static programmable control. In addition, the output signal of each buffer may be applied to another adjacent interconnection conductor via a pass gate. The pass gates associated with several or all of the subregions in each region may be controlled by one of the subregions in that region or an adjacent region. This pass gate circuitry provides tri-state-type operation of some of the interconnection conductors, with the tri-state operation being locally controlled and therefore without the extensive routing and consequent delay of enable signals that is typical of prior art tri-state driver circuitry.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
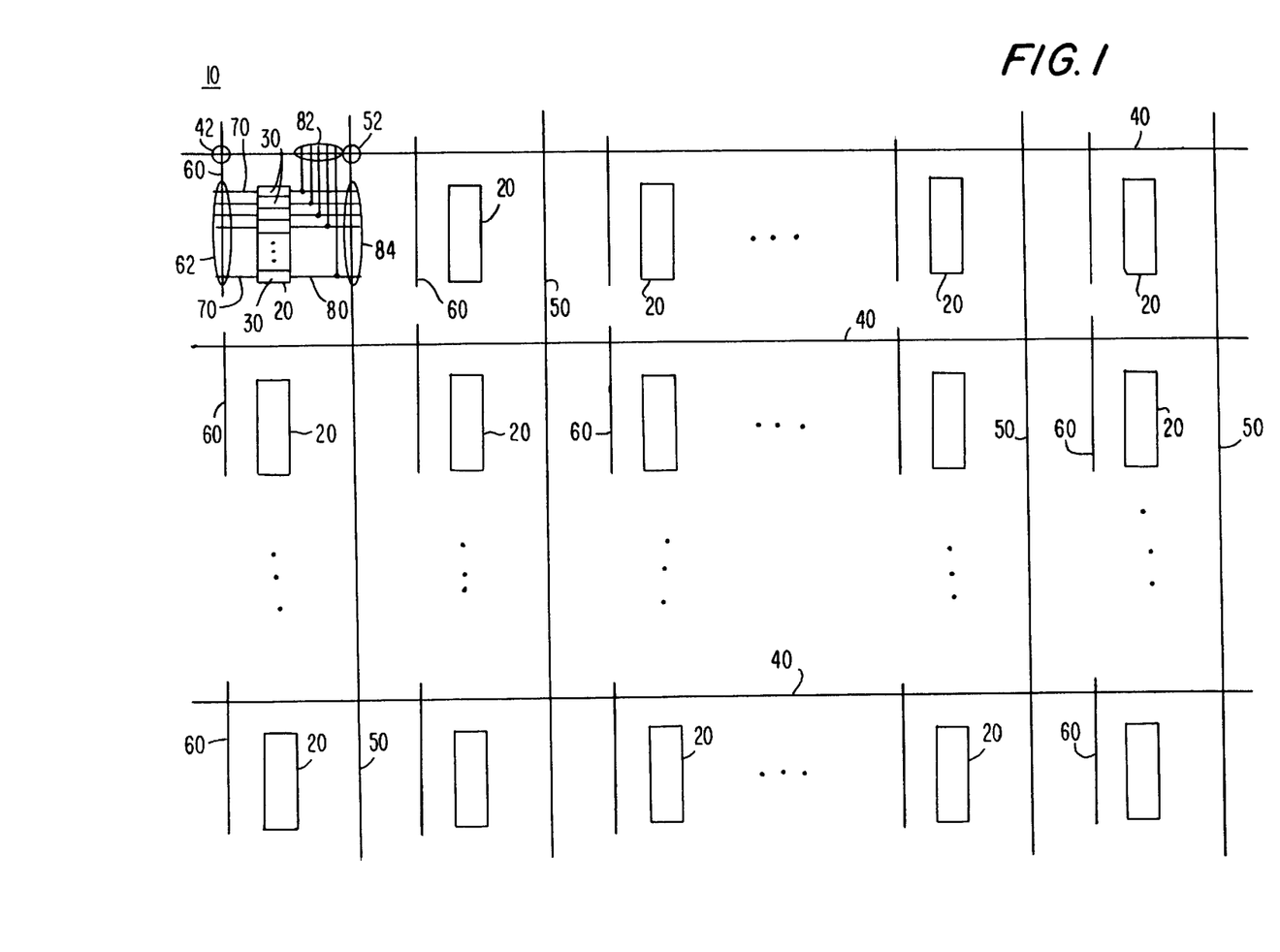
FIG. 1 is a simplified block diagram of an illustrative programmable logic device with which this invention can be used.

An illustrative programmable logic device 10 which can be constructed in accordance with this invention is shown in FIG. 1. The most detail is shown in the upper left-hand corner of FIG. 1. Some of this detail is omitted in other portions of FIG. 1 to avoid unduly burdening the drawing. Device 10 includes a plurality of regions 20 of programmable logic disposed on the device in a two-dimensional array of intersecting rows and columns of regions. Each region 20 includes a plurality of subregions 30 of programmable logic which can be constructed as described above in the background section of this specification. For example, each region 20 may include ten subregions 30. A plurality of horizontal interconnection conductors 40 is associated with each row of regions 20. A plurality of vertical interconnection conductors 50 is associated with each column of regions 20. A plurality of local interconnection conductors 60 is associated with each region 20.

Programmable connections 42 are provided for programmably selectively connecting the horizontal conductors 40 adjacent to each region to the local conductors 60 adjacent to that region. Programmable connections 62 are provided for programmably selectively connecting the local conductors 60 adjacent to each region to input conductors 70 of that region. Programmable connections 82 and 84 are provided for programmably selectively connecting output conductors 80 of each region to the horizontal and vertical conductors 40 and 50 adjacent to that region. And programmable connections 52 are provided for programmably selectively connecting intersecting horizontal and vertical conductors 40 and 50.

The structure shown in FIG. 1 is only one example of many possible programmable logic device architectures with which this invention can be used. For example, the programmable connectivity shown in FIG. 1 is only illustrative, and different or additional connectivity can be employed if desired. To briefly consider just some of these possibilities, more direct feedback can be provided from subregion outputs 80 to the local conductors 60 associated with the region that produces those subregion outputs. As another possibility, rather than providing separate programmable connections 52, the functionality provided by those connections can be combined into connections 82 and 84 and the associated circuitry.

Figure 2:
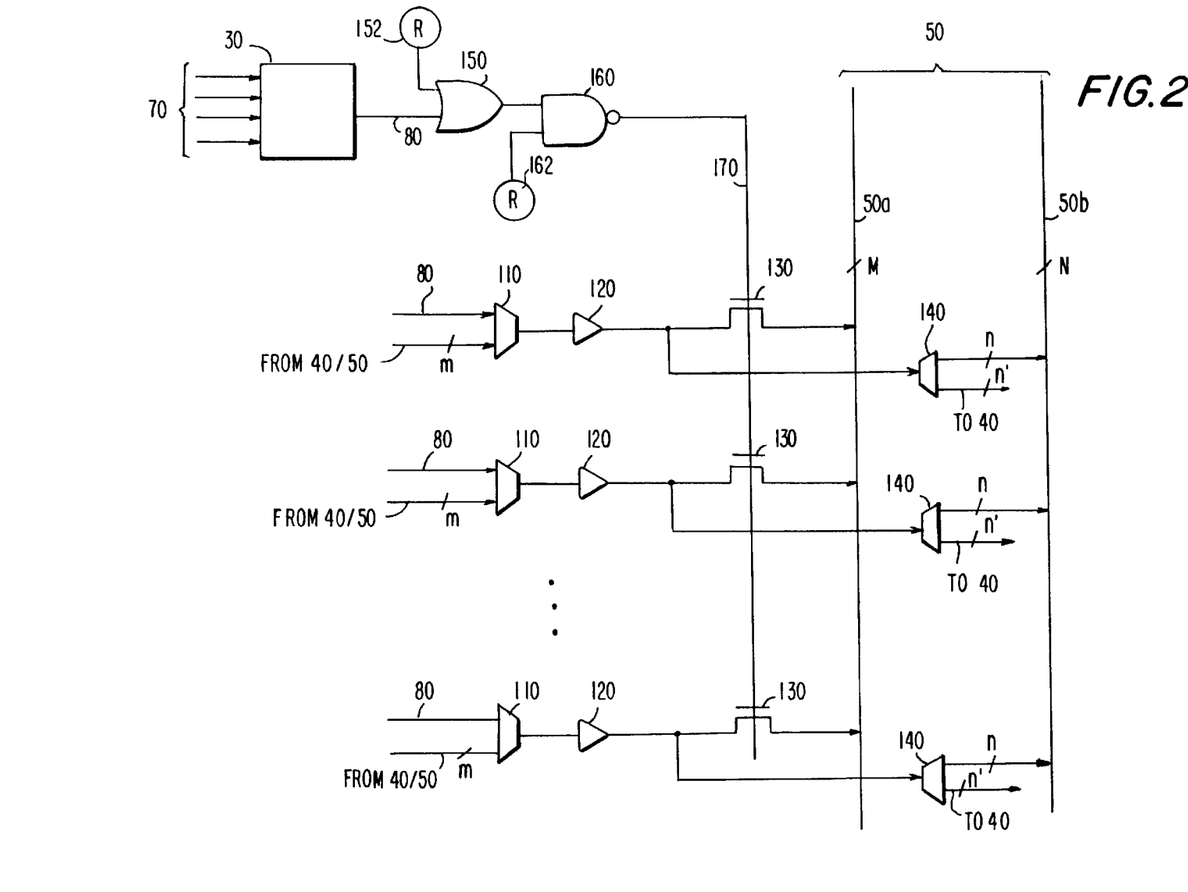
FIG. 2 is a simplified schematic block diagram of a representative portion of a programmable logic device constructed in accordance with the invention.

An illustrative embodiment of the improved driver circuitry of this invention is shown in FIG. 2. The circuitry shown in FIG. 2 is associated, at least for the most part, with one representative region 20 in FIG. 1. (Of course, each region 20 will typically have similar circuitry associated with it.) The output signal 80 of each subregion 30 in the associated region is applied to one input of a respective, conventional, programmable logic connector ("PLC") 110. Other inputs to each PLC 110 are signals from several (i.e., "m") horizontal and/or vertical conductors 40 and 50. In the simplest embodiment, each PLC 110 is programmable (by function control elements ("FCEs") that are not shown separately in FIG. 2) to select one of its input signals for application to its output terminal. (In more complex embodiments, each PLC may be programmable to perform various logical operations on one or more of its inputs in order to produce an output.)

The output signal of each PLC 110 is applied to an associated, conventional buffer 120. Each buffer amplifies and otherwise conditions the applied signal for use in driving one or more conductors 40 and/or 50.

The output signal of each buffer 120 is applied to an associated NMOS pass gate transistor 130 and also to the input terminal of an associated, conventional PLC 140. In the illustrative embodiment shown in FIG. 2 all of the pass gates 130 associated with each region 20 are controlled in parallel by the signal on lead 170. This signal may be dynamically controlled by the output signal of a subregion 30 in the associated region or a subregion 30 in another region adjacent to the associated region. Alternatively, the signal on lead 170 may be programmed or fixed at logic 0 or logic 1 by appropriately programming FCEs 152 and 162. For example, if FCE 162 is programmed logic 0, the output signal of NAND gate 160 is always logic 1. If FCEs 152, 162 are both programmed logic 1, the output signal of NAND gate 160 is always logic 0. If FCE 152 is programmed logic 0 and FCE 162 is programmed logic 1, the signal on lead 170 is the inverted output of the subregion 30 shown in FIG. 2. Thus the signal on lead 170 can be either the dynamic inverted output of the depicted subregion 30 or static logic 0 or logic 1.

The output signal of each pass gate 130 is applied to a respective one of vertical conductors 50a. Each of these pass gate 130 output signals is effectively tri-statable by disabling the associated pass gate (signal on lead 170 is logic 0). The vertical conductors 50 adjacent to each column of regions 20 are divided into two groups of M conductors 50a and N conductors 50b. For example, if there are ten subregions 30 in each region 20, there may be ten conductors in each group of conductors 50a (i.e., M=10). Substantially more conductors may be included in each group of conductors 50b. For example, N may be a number like 70. Each conductor 50a receives the output of one pass gate 130 associated with each row of regions 20. Thus each conductor 50a has several pass gates 130 connected to it (i.e., one in each row of regions 20). However, only one group of pass gates 130 along conductors 50a will be enabled (by the associated signal 170) at any one time. The other pass gates 130 along those conductors 50a that are not enabled (i.e., in other rows) are effectively tri-stated as described above. Accordingly, conductors 50a are operable as tri-state-type lines.

Considering now the other connectivity of the output signals of buffers 120, each of PLCs 140 is programmable by FCEs (not shown separately) to apply the associated buffer 120 output signal to one or more of n vertical conductors 50b and/or n' horizontal conductors 40. (If desired, PLCs 140 may be additionally programmable to perform logic on the signal being passed.)

From the foregoing it will be seen that each buffer 120 is effectively shared between two uses: (1) tri-state-type driving of conductors 50a, and (2) static connection driving of conductors 50b and/or 40. NMOS pass gates 130, which are used in the tri-state-type operation, can be much smaller than dedicated tri-state drivers. In addition, the enable signal 170 for pass gates 130 comes from a local source such as a nearby subregion 30, thereby avoiding extensive routing and consequent delay of the enable signal.

Figure 3:
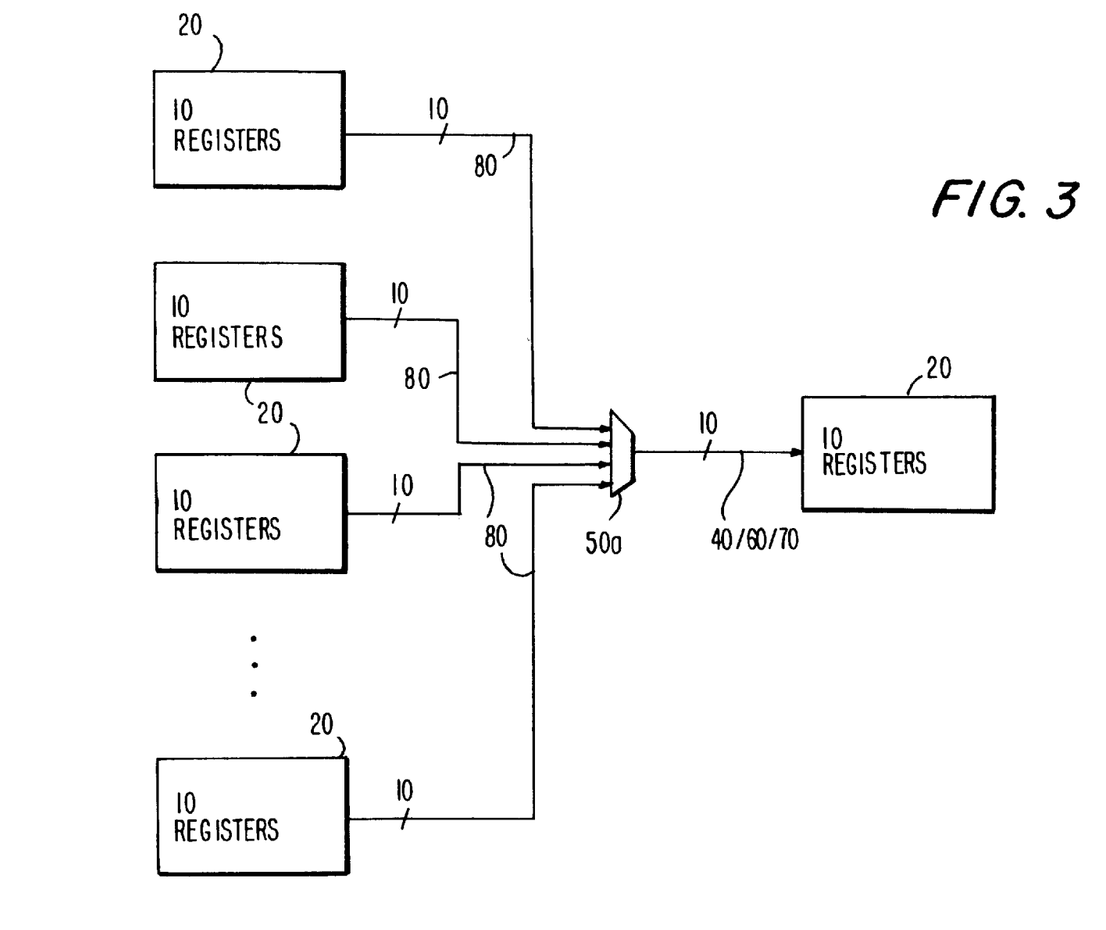
FIG. 3 is a simplified flow diagram illustrating a possible use of circuitry of the type shown in FIGS. 1 and 2.

FIG. 3 illustrates the type of dynamic switching that can be easily implemented in a programmable logic device 10 constructed as shown in FIGS. 1 and 2. The several regions 20 on the left in FIG. 3 are all in one column on device 10. The region 20 to the right is typically in another column. The desired task is to transfer the contents of the ten registers in the subregions 30 that make up any one of the regions 20 on the left to the ten registers in the subregions that make up the region on the right. This can be done by enabling the pass gates 130 associated with the desired source registers, while disabling the pass gates 130 associated with all of the other possible source registers. In this way conductors 50a are effectively used as a multiplexer for transferring the desired source data to the destination registers on the right. Use of conductors 50a can be changed dynamically, so that at another time other registers on the left can be used as the source of the data transferred to the registers on the right. For example, the subregion 30 that controls a group of pass gates 130 can be programmed to act as an address decoder (the address data being applied to the subregion via its inputs 70). When the subregion 30 receives the address it is programmed to recognize, it outputs a signal that enables the associated pass gates 130, thereby allowing the signal sources (e.g., subregion outputs 80) connected to the inputs of the associated buffers 120 to make use of conductors 50a. All of the other subregions 30 that control pass gates 130 connected to those conductors 50a are programmed to recognize different addresses. Thus at any one time only the pass gates 130 associated with one region 20 in a column are enabled. All of the other pass gates 130 in that column are effectively tri-stated.

Figure 4:
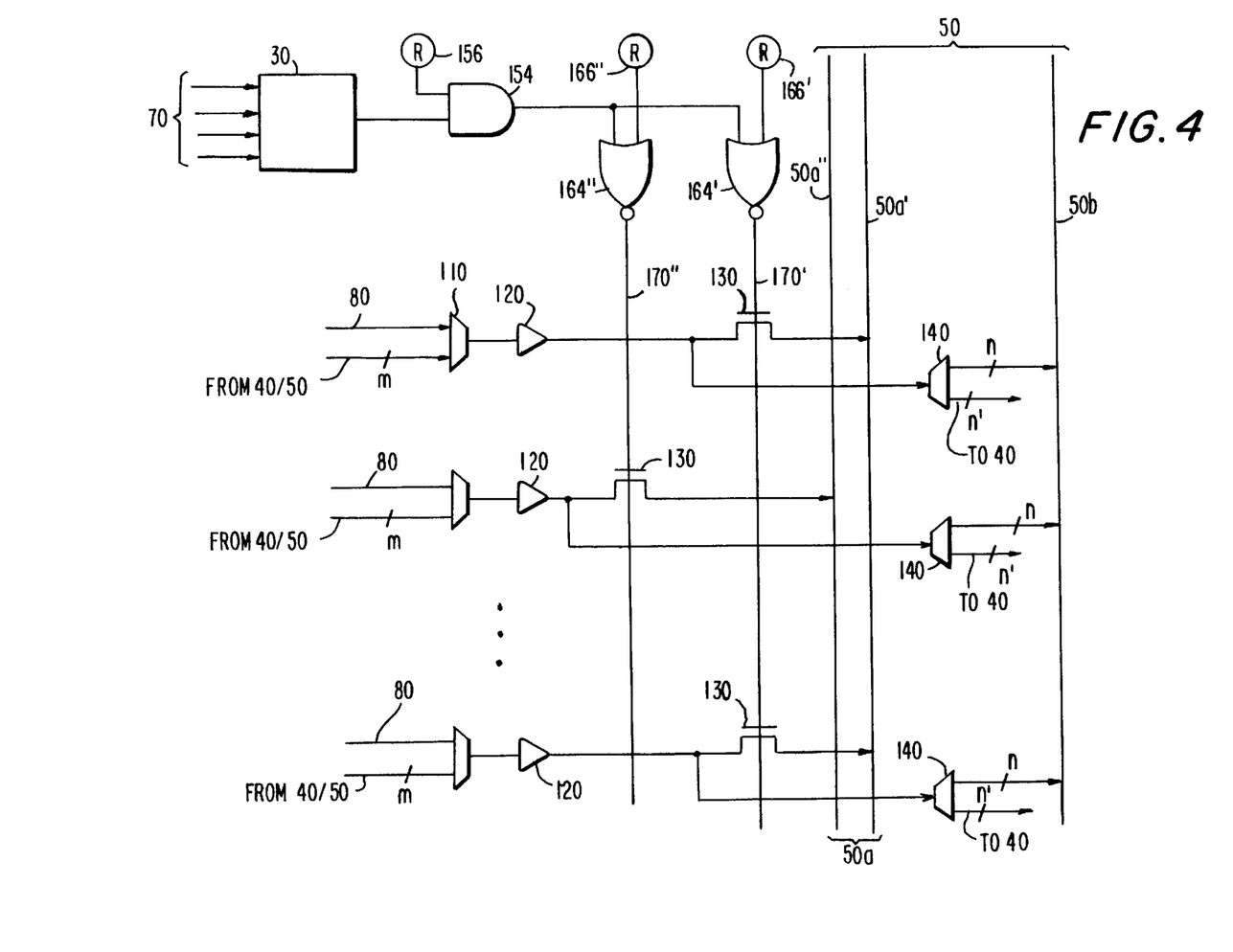
FIG. 4 is a view similar to FIG. 2 showing another illustrative embodiment in accordance with the invention.

FIG. 4 shows another illustrative embodiment in which control of the pass gates 130 associated with each region 20 is at least partly subdividable. Half of the pass gates 130 associated with each region 20 are controlled by the signal on lead 170', and the other half of those pass gates 130 are controlled by the signal on lead 170". Both of leads 170' and 170" can carry the (inverted) output signal of depicted subregion 30. (This assumes FCE 156 programmed logic 1 and FCEs 166' and 166" programmed logic 0.) Alternatively, both of leads 170' and 170" can be forced to logic 1 by programming all of FCEs 156, 166', and 166" logic 0. As still another possibility, either or both of FCEs 166' and 166" can be programmed logic 1 to force the associated lead or leads 170'/170" to logic 0. If only one of FCEs 166' and 166" is programmed logic 1, then the lead associated with the other of these FCEs can be dynamically controlled by the output signal of subregion 30 (assumes FCE 156 programmed logic 1) or can be forced to logic 1 (by programming FCE 156 logic 0). In respects other than those specifically mentioned above, the embodiment shown in FIG. 4 may be similar to the embodiment shown in FIG. 2.

The embodiment shown in FIG. 4 allows somewhat greater flexibility in the use of tri-state-type conductors 50*a*. For example, if only some of conductors 50*a* need to be driven from the subregions 30 in an adjacent region, the pass gates 130 associated with the other subregions in that region can be gated off (associated FCE 166' or 166" programmed logic 1). Those other subregions can then be used for other purposes (e.g., driving conductors 50*b* and/or 40).

Figure 5:
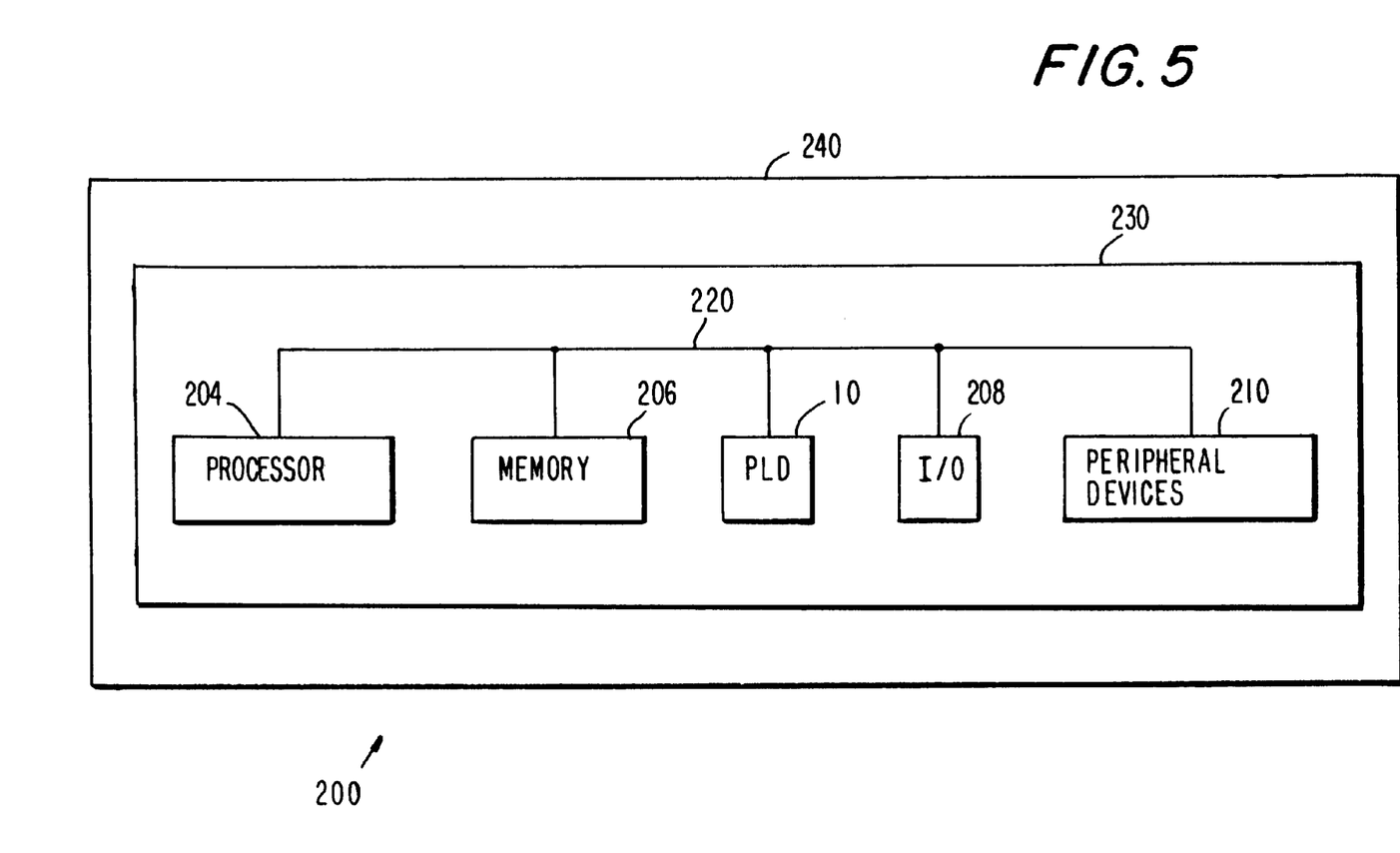
FIG. 5 is a simplified block diagram of an illustrative system employing a programmable logic device incorporating driver circuitry in accordance with the invention.

FIG. 5 illustrates a programmable logic device 10 (which includes driver circuitry in accordance with this invention) in a data processing system 200. In addition to device 10, data processing system 200 may include one or more of the following components: a processor 204; memory 206; I/O circuitry 208; and peripheral devices 210. These components are coupled together by a system bus 220 and are populated on a printed circuit board 230 which is contained in an end-user system 240.

System 200 can be used in a wide variety of applications, such as computer networking, data networking, instrumentation, video processing, digital signal processing, or any other application where the advantage of using reprogrammable logic is desirable. Programmable logic device 10 can be used to perform a variety of different logic functions. For example, programmable logic device 10 can be configured as a processor or controller that works in cooperation with processor 204. Programmable logic device 10 may also be used as an arbiter for arbitrating access to a shared resource in system 200. In yet another example, programmable logic device 10 can be configured as an interface between processor 204 and one of the other components in system 200. It should be noted that system 200 is only exemplary, and that the true scope and spirit of the invention should be indicated by the following claims.

The PLCs mentioned throughout this specification (which includes the appended claims) can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the components of PLCs can be controlled by various, programmable, function control elements ("FCEs"), which are not always shown separately in the accompanying drawings. (With certain PLC implementations (e.g., fuses and metal optional links) separate FCE devices are not required, so that in those cases any depiction of FCE devices in the accompanying drawings merely indicates that the PLCs are programmable.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

It will be understood that the foregoing is only illustrative of the principles of the invention, and that various modifications can be made by those skilled in the art without departing from the scope and spirit of the invention. For example, the principle illustrated by FIG. 4 can be extended to even more subdivisions of tri-state-type conductors 50*a*. As another example of modifications within the scope of the invention, more than one pass gate 130 can be connected to the output of each buffer 120. The outputs of such multiple pass gates can go to different conductors 50, or some can go to horizontal conductors 40 instead of only to vertical conductors 50. If provided, the multiple pass gates 130 associated with each buffer 120 can be partly or wholly independently controlled (e.g., in the manner that the pass gates in the two groups shown in FIG. 4 can be independently controlled if desired). The number of subregions 30 in each region 20 can be varied, as can the numbers of rows and columns of regions. The number of inputs and outputs of each subregion 30 can also be changed if desired. Different types of logic can be used in the subregions or regions. For example, instead of look-up tables, sum-of-products logic could be employed. It will also be understood that terms like "row" and "column", "horizontal" and "vertical", "top" and "bottom", "left" and "right", and other similar directional or orientational characterizations are entirely arbitrary and are employed only as relative terms for convenience herein. These terms are not intended to have any absolute or fixed meaning or to limit the scope of the claims to any particular device orientations or directions.

The invention claimed is:

1. Driver circuitry for use in applying signals to interconnection conductors on a programmable logic device comprising:

a plurality of first interconnection conductors;

a plurality of second interconnection conductors;

a plurality of buffer circuits, each having a buffer input lead and a buffer output lead, wherein each buffer circuit is configured to receive and buffer an applied signal on the buffer input lead in order to produce a buffered output signal on the buffer output lead;

a static programmable connection associated with each of the buffer circuits, the static programmable connection having a static programmable connection input lead connected to the buffer output lead, wherein the static programmable connection is configured to apply the buffered output signal of the associated buffer circuit to a respective one of the first interconnection conductors associated with that buffer circuit if the static programmable connection is so programmed;

a pass gate associated with each of the buffer circuits, the pass gate having a pass gate input lead connected to the buffer output lead, wherein the pass gate is configured to apply the buffered output signal of the associated buffer circuit to a respective one of the second interconnection conductors associated with that buffer circuit if the pass gate is enabled; and enable signal generating circuitry configured to produce a signal which selectively enables a plurality of the pass gates in parallel.

2. The circuitry defined in claim 1 wherein the enable signal generating circuitry comprises:

programmable logic circuitry on the programmable logic device and configured to perform logic to selectively produce the signal which enables the plurality of pass gates in parallel.

3. The circuitry defined in claim 2 further comprising:

programmable circuitry configured to selectively override the signal produced by the programmable logic circuitry in order to hold the plurality of pass gates in an enabled condition.

4. The circuitry defined in claim 2 further comprising:

programmable circuitry configured to selectively override the signal produced by the programmable logic circuitry in order to hold the plurality of pass gates in a disabled condition.

5. The circuitry defined in claim 2 further comprising:

programmable circuitry configured to selectively override, for a subplurality of the plurality of pass gates, the signal produced by the programmable logic circuitry in order to hold the subplurality of pass gates in an enabled condition.

6. The circuitry defined in claim 2 further comprising:

programmable circuitry configured to selectively override, for a subplurality of the plurality of pass gates, the signal produced by the programmable logic circuitry in order to hold the subplurality of pass gates in a disabled condition.

7. The circuitry defined in claim 1 wherein the pass gate associated with each of the buffer circuits is configured to produce a tri-state output to the associated second interconnection conductor when the pass gate is not enabled.

8. The circuitry defined in claim 1 further comprising:

a second plurality of buffer circuits, each of which is configured to receive and buffer a second applied signal in order to produce a second buffered output signal;

a second static programmable connection associated with each of the buffer circuits in the second plurality and configured to apply the second buffered output signal of the associated buffer circuit in the associated second plurality to a respective one of the first interconnection conductors associated with that buffer circuit in the associated second plurality if the associated second static programmable connection is so programmed;

a second pass gate associated with each of the buffer circuits in the second plurality and configured to apply the second buffered output signal of the associated buffer circuit in the second plurality to a respective one of the second interconnection conductors associated with that buffer circuit in the associated second plurality if the associated second pass gate is enabled; and second enable signal generating circuitry configured to produce a second signal which selectively enables in parallel a plurality of the second pass gates that are associated with the buffer circuits in the second plurality.

9. The circuitry defined in claim 8 wherein the second enable signal generating circuitry comprises:

second programmable logic circuitry on the programmable logic device and configured to perform logic to selectively produce the second signal which enables in parallel the plurality of second pass gates that are associated with the buffer circuits in the second plurality.

10. A digital processing system comprising:

processing circuitry;

a memory coupled to said processing circuitry; and the programmable logic device having the driver circuitry defined in claim 1 and coupled to the processing circuitry and the memory.

11. A printed circuit board on which is mounted the programmable logic device having the driver circuitry defined in claim 1.

12. The printed circuit board defined in claim 11 further comprising:

a memory mounted on the printed circuit board and coupled to the programmable logic device.

13. The printed circuit board defined in claim 11 further comprising:

processing circuitry mounted on the printed circuit board and coupled to the programmable logic device.

* * * * *